United States Patent
Pax et al.

(10) Patent No.: US 6,223,317 B1
(45) Date of Patent: Apr. 24, 2001

(54) BIT SYNCHRONIZERS AND METHODS OF SYNCHRONIZING AND CALCULATING ERROR

(75) Inventors: George E. Pax, Boise; David K. Ovard, Meridian, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/033,065

(22) Filed: Feb. 28, 1998

(51) Int. Cl.[7] .................................................. G06F 11/00
(52) U.S. Cl. ......................... 714/744; 714/798; 375/368; 375/362
(58) Field of Search .................... 375/356, 260, 375/348, 368, 362; 164/108; 714/4, 744, 798, 799

(56) References Cited

U.S. PATENT DOCUMENTS

| | | | |
|---|---|---|---|
| 4,005,266 | * | 1/1977 | Lehr et al. ............................ 375/356 |
| 4,075,632 | | 2/1978 | Baldwin et al. ....................... 343/6.8 |
| 4,280,222 | * | 7/1981 | Flower ................................. 375/260 |
| 4,414,676 | * | 11/1983 | Kraul et al. .......................... 164/108 |
| 4,926,182 | | 5/1990 | Ohta et al. ............................ 342/44 |
| 5,052,026 | | 9/1991 | Walley ................................. 375/373 |
| 5,204,865 | * | 4/1993 | Moritoki et al. ......................... 714/4 |
| 5,249,205 | * | 9/1993 | Chennakeshu et al. ............. 375/348 |
| 5,487,090 | | 1/1996 | Ide . |
| 5,513,377 | | 4/1996 | Capowski et al. . |
| 5,559,841 | | 9/1996 | Pandula ................................. 375/375 |
| 5,621,412 | | 4/1997 | Sharpe et al. ........................... 342/51 |
| 5,649,296 | | 7/1997 | MacLellan et al. ................. 455/38.2 |
| 5,694,068 | | 12/1997 | Rokugo . |
| 5,694,441 | | 12/1997 | Suzuki . |

FOREIGN PATENT DOCUMENTS

| | | |
|---|---|---|
| 0 410 594 | 7/1990 | (EP) . |
| 0 551 695 | 1/1992 | (EP) . |
| 0 812 079 | 6/1997 | (EP) . |
| 2 697 956 | 11/1992 | (FR) . |
| 91/10282 | 7/1991 | (WO) . |

OTHER PUBLICATIONS

Y. Matsumoto et al., "A New Burst Coherent Demodulator for Microcellular TDMA/TDD Systems", vol. E77–B *IEICE Trans. Commun.* No. 7 (Jul. 1994), pp. 927–933.

* cited by examiner

*Primary Examiner*—Albert Decady
*Assistant Examiner*—David Ton
(74) *Attorney, Agent, or Firm*—Wells, St. John, Roberts, Gregory & Matkin, P.S.

(57) ABSTRACT

The present invention includes bit synchronizers and methods of synchronizing and calculating error. One method of synchronizing with a data signal in accordance with the present invention includes providing a data signal having a first portion and a second portion, generating a timing signal, first adjusting the timing signal during the first portion of the data signal, accumulating a history value during the first portion of the data signal, and second adjusting the timing signal during a second portion of the data signal using the history.

59 Claims, 11 Drawing Sheets

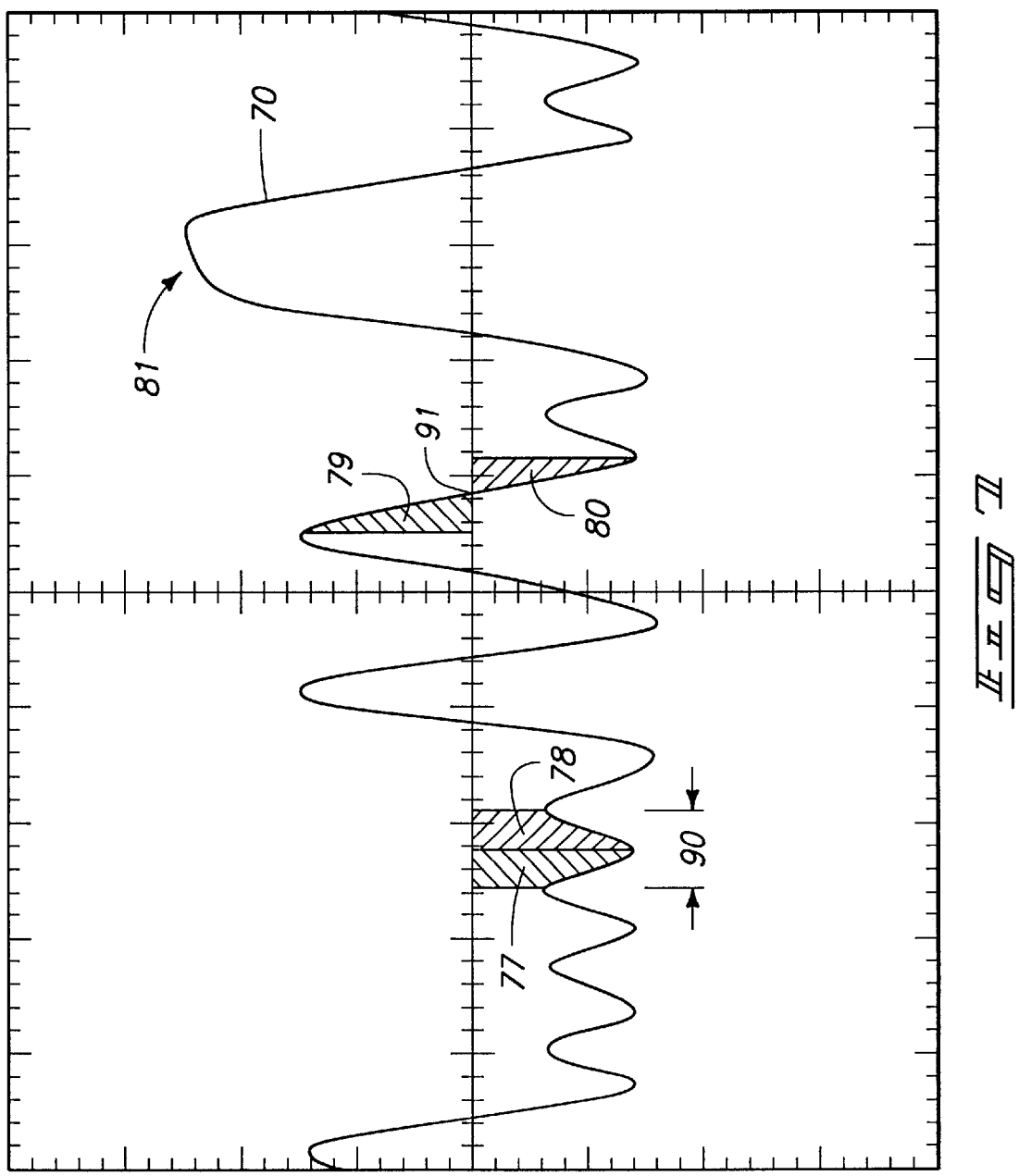

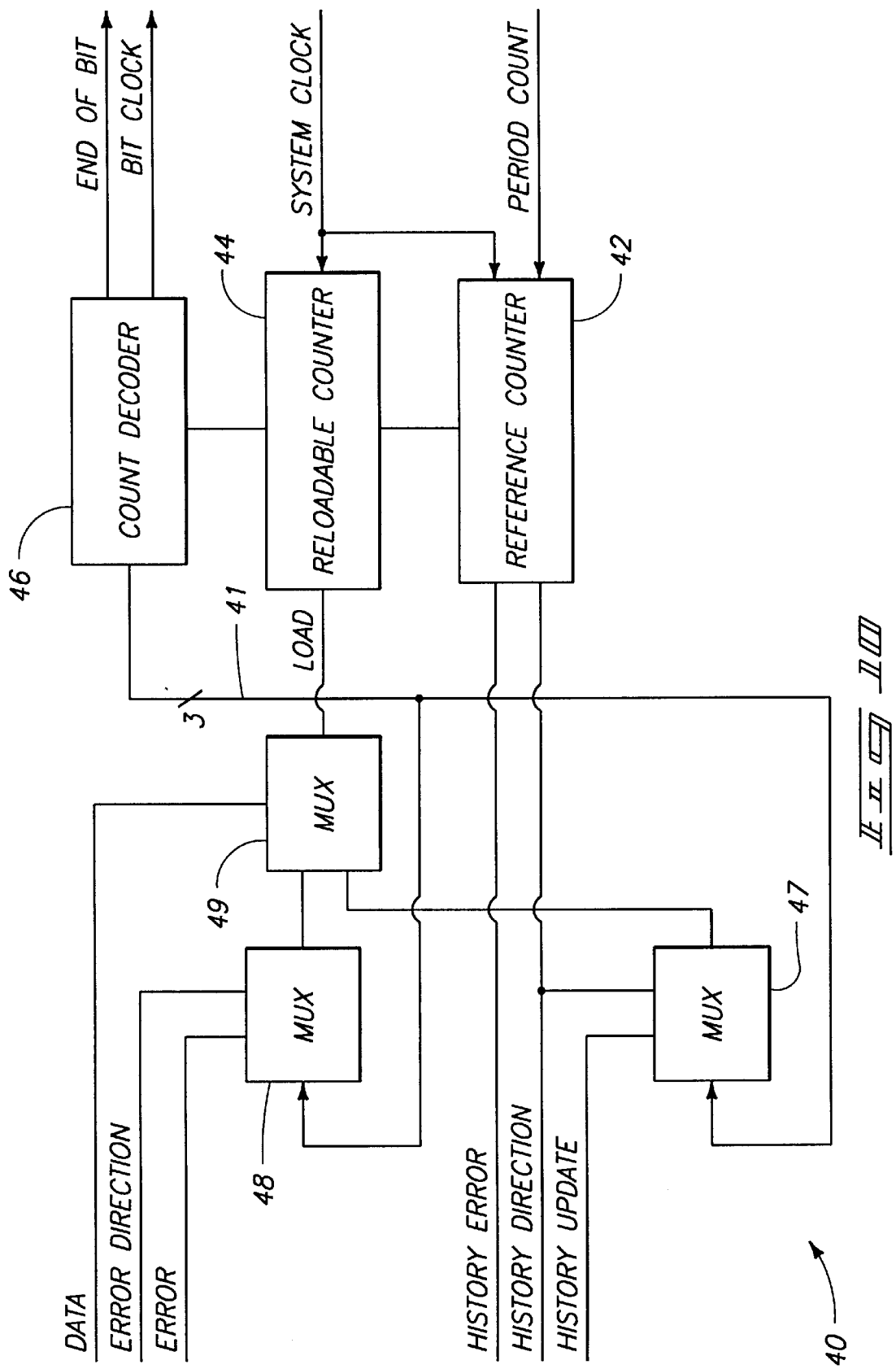

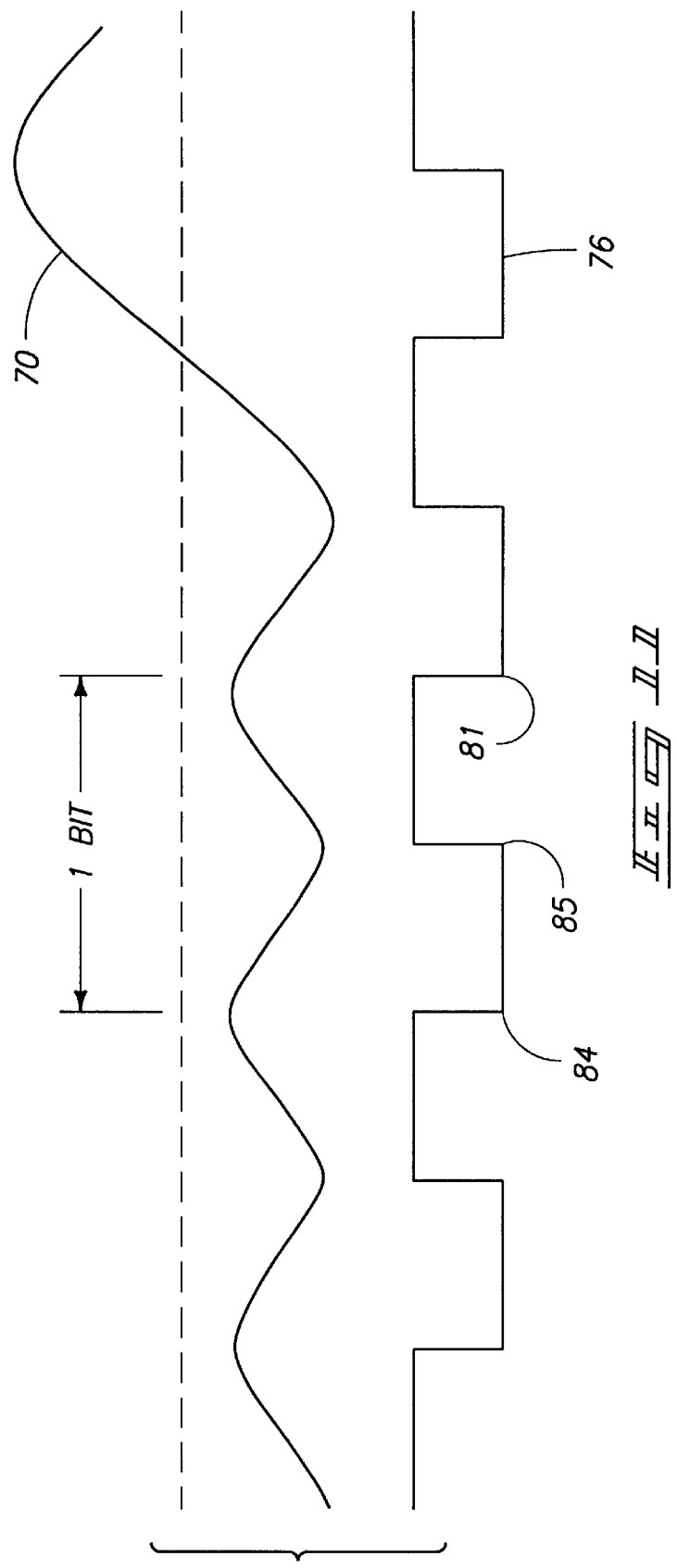

BIT SYNCHRONIZERS AND METHODS OF SYNCHRONIZING AND CALCULATING ERROR

TECHNICAL FIELD

The present invention relates to bit synchronizers and methods of synchronizing and calculating error.

BACKGROUND OF THE INVENTION

Radio frequency (wireless) communications systems are known in the art. Radio frequency communications systems typically include a transmitter and a receiver. Other communications systems are bidirectional and include a first transponder that can send or receive a radio frequency communication, and a second transponder that can receive the radio frequency communications from the first transponder and transmit signals, via radio frequency, back to the first transponder.

Radio frequency identification devices define another form of bidirectional communications systems. As large numbers of objects are moved in inventory, product manufacturing, and merchandising operations, there is a continuous challenge to accurately monitor the location and flow of objects. Additionally, there is a continuing goal to interrogate the location of objects in an inexpensive and streamlined manner. One way of tracking objects is with an electronic identification system.

One electronic identification system utilizes an RF transponder device affixed to an object to be monitored. An interrogator is provided to transmit an interrogation signal to the device. The device receives the signal, then generates and transmits a responsive signal which may identify the device. The interrogation signal and the responsive signal are typically radio-frequency (RF) signals produced by an RF transmitter circuit. Since RF signals can be transmitted over greater distances than magnetic fields, RF-based transponder devices tend to be more suitable for applications requiring tracking of a tagged device that may not be in close proximity to an interrogator. For example, radio frequency based transponder devices tend to be more suitable for inventory control or tracking.

Synchronization of a particular receiving device (e.g., the interrogator) of a communication system to the data signal being received is necessary to achieve optimal sampling of the received data signal. Optimized sampling of the received data signal minimizes error rates. In prior art analog communication systems, phase lock loops including loop filters and voltage controlled oscillators are typically used to align a clock with phasing of incoming data.

Some wireless communication systems communicate via digital data transmissions. Communicating via a digital format provides numerous advantages including encoding, various modulation techniques, etc. Optimal sampling of the received signal provides reliable reception of the data at the receive side of such digital systems.

Problems often experienced in this art include the monitoring of error such as separation of the sampling signal from the received data signal. Further problems include maintaining proper alignment of the sampling signal with the received data signal during reception of the entire data signal.

Therefore, it is desirable to provide a communication system which achieves the benefits of digital communication while overcoming the problems associated therewith.

SUMMARY OF THE INVENTION

A first aspect of the present invention provides a bit synchronizer configured to generate a timing signal for optimizing the sampling of a received data signal. One embodiment of the bit synchronizer comprises an error generator, a bit clock generator and history circuitry. The timing signal preferably has a frequency approximately equal to the bit rate of the data signal. In addition, the bit synchronizer is configured to detect error of the timing signal with respect to the data signal and adjust the timing signal responsive to the detection of error. Further, the history circuitry of the described bit synchronizer accumulates error to define a history. The bit synchronizer utilizes the history to update the timing signal during portions of the data signal having insufficient timing information.

The present invention also provides methods of synchronizing. Some methods of synchronizing include synchronizing a timing signal, such as a bit clock signal, with a received data signal. One method of synchronizing according to the present invention comprises providing a data signal having a first portion and a second portion and generating a timing signal. The method further provides first adjusting the timing signal during the first portion of the data signal and accumulating a history value during the first portion of the data signal. The described method provides second adjusting the timing signal during a second portion of the data signal using the history.

Another method of synchronizing comprises providing a data signal including digital information and deriving timing information during a first portion of the data signal. Further, the method provides generating a timing signal, detecting an absence of timing information during a second portion of the data signal, and adjusting the timing signal during the second portion of the data signal. This described embodiment utilizes a specified digital value to derive timing information. Sufficient timing information is typically absent when the specified digital value is not received.

The invention provides methods of calculating error of a timing signal with respect to a data signal. The described method includes receiving a data signal containing plural digital values and first analyzing the data signal corresponding to a first portion of a selected digital value of the data signal. The method also includes providing a first reference value responsive to the first analyzing. One aspect of the method includes second analyzing the data signal corresponding to a second portion of the selected digital value of the data signal and providing a second reference value responsive to the second analyzing. Following the analyzings, the method includes comparing the first reference value with the second reference value.

BRIEF DESCRIPTION OF THE DRAWINGS

Preferred embodiments of the invention are described below with reference to the following accompanying drawings.

FIG. 7 is a graphical representation of another exemplary segment of the received data signal.

FIG. 10 is a functional block diagram of one embodiment of bit clock generator circuitry of the bit synchronizer.

FIG. 11 is diagrammatic representation of a bit clock signal and the data signal.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
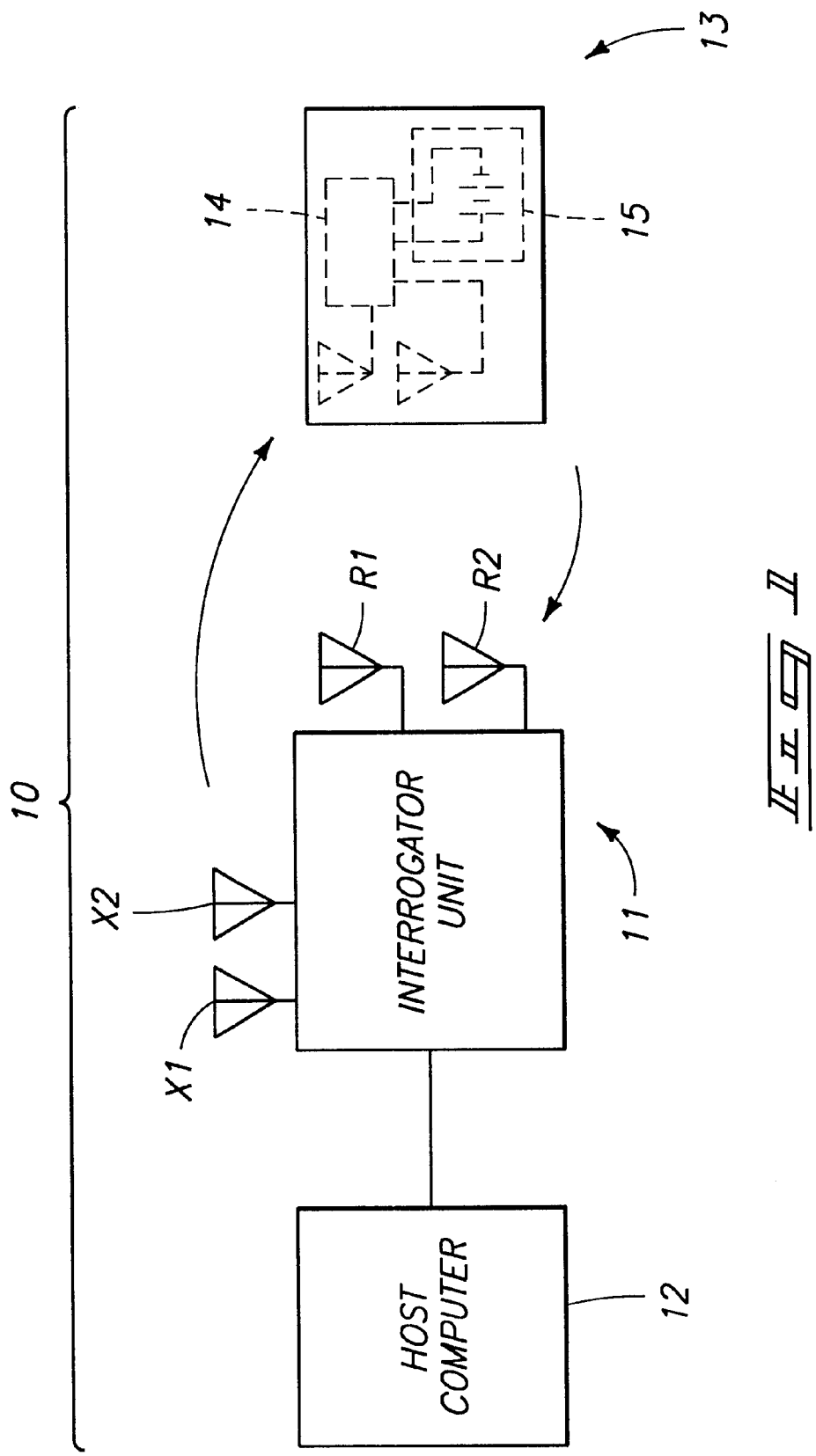
FIG. 1 is a functional block diagram of a communication system including an interrogator and a data communication device.

FIG. 1 illustrates a wireless communications system 10 embodying the invention. Communications system 10 includes an interrogator unit (interrogator) 11 and a host computer 12 in communication with the interrogator 11. The communications system 10 further includes a wireless data communication device 13. Data communication device 13 is configured to communicate via radio frequency signals in one embodiment.

While other embodiments are possible, the illustrated wireless data communications device 13 includes a transponder 14 having a receiver and a transmitter. The data communications device 13 further includes a power source 15 connected to the transponder 14 to supply power to the transponder 14. The power source 15 is a thin film battery in the illustrated embodiment. However, in alternative embodiments, other forms of power sources are employed.

Data communications device 13 further includes at least one antenna connected to the transponder 14 for providing transmission and reception of wireless signals. In the illustrated embodiment, data communications device 13 includes at least one transmit antenna connected to the transponder 14 for radio frequency transmission by the transponder 14, and at least one receive antenna connected to the transponder 14 for radio frequency reception by the transponder 14. In another embodiment, data communications device 13 includes a single antenna for transmitting and receiving.

In the illustrated embodiment, transponder 14 is provided in the form of an integrated circuit. However, in alternative embodiments, some or all of the circuitry of the transponder 14 is not necessarily all included in a single integrated circuit.

Wireless data communication device 13 can be included in any appropriate housing or packaging. In one example, the housing comprises plastic or other suitable material which encapsulates the transponder 14 and power source 15. The housing of some communication devices 13 may define a card.

In the illustrated embodiment, communications system 10 includes multiple selectable transmit antennas (two transmit antennas X1 and X2 are shown in FIG. 1) and multiple selectable receive antennas (two receive antennas R1 and R2 are shown in FIG. 1) connected to the interrogator 11. In one embodiment, communications system 10 includes multiple selectable antennas that are respectively used both for transmitting and receiving by the interrogator 11.

Generally, interrogator 11 transmits a wireless interrogation signal or forward link command via one of the antennas X1, X2, etc. Data communication device 13 receives the incoming interrogation signal via its receive antenna. Upon receiving the signal, data communication device 13 responds by generating and transmitting a responsive signal or reply return link which is configured to uniquely identify the responding device 13 in accordance with one embodiment of the invention. Provision of such a unique identification signal identifies any article (e.g., object, person, etc.) with which data communication device 13 is associated. Other embodiments are possible for data communication device 13, such as cellular telephone embodiments, or embodiments that include global positioning circuitry.

In the described embodiment, multiple data communication devices 13 can be employed; however, there is generally no communication between the multiple devices 13 in such an embodiment. Instead, the multiple data communication devices 13 are configured to communicate with the interrogator 11. Multiple data communication devices 13 can be used in the same field of an interrogator 11 (i.e., within communications range of a single interrogator 11). Similarly, multiple interrogators 11 can be in proximity to one or more of data communication devices 13.

Figure 2:
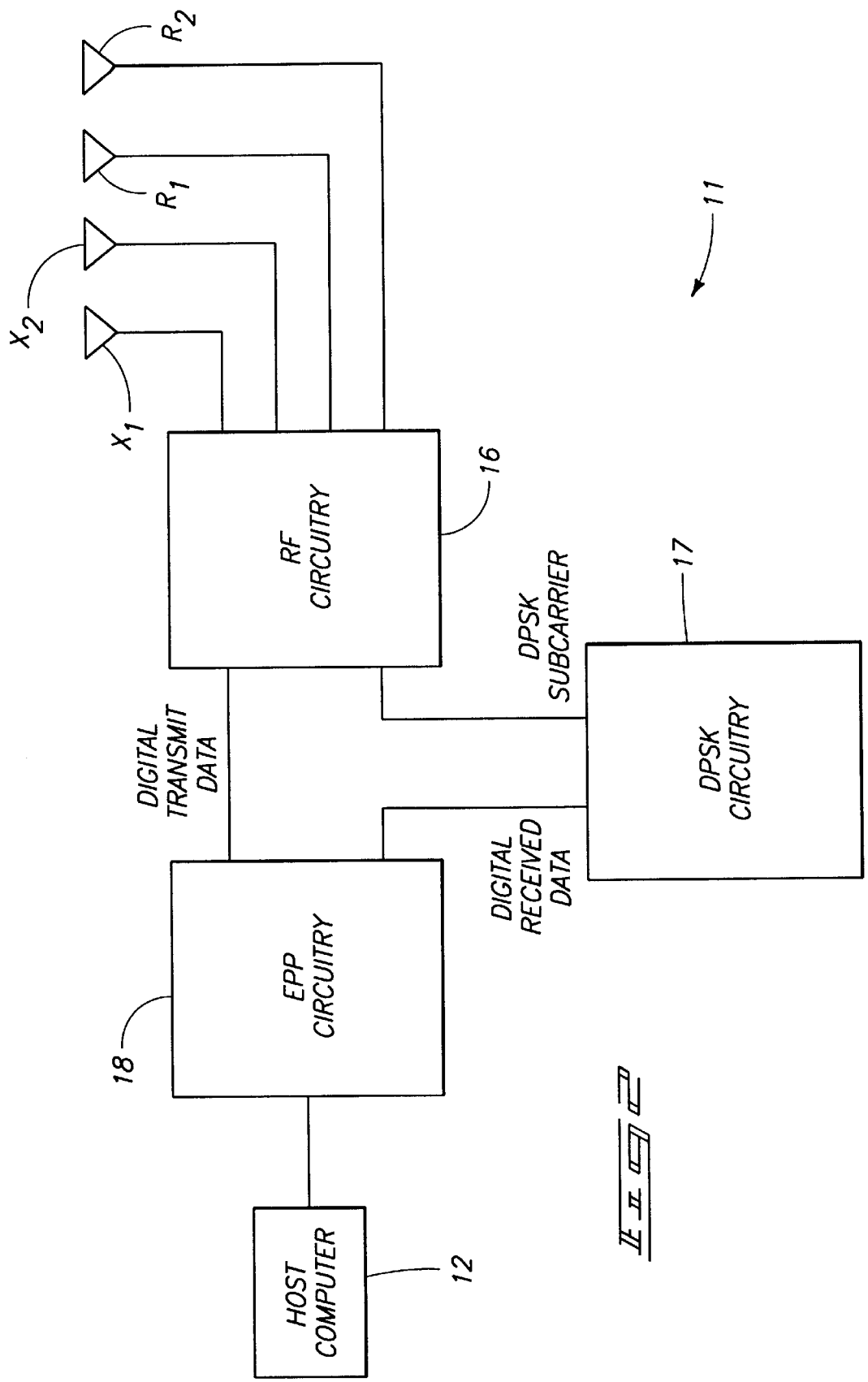
FIG. 2 is a functional block diagram of the interrogator embodying the present invention.

Referring to FIG. 2, one embodiment of interrogator 11 according to the present invention is shown. The illustrated interrogator 11 includes RF (radio frequency) circuitry 16, DPSK (differential phase shift keying) circuitry 17 and enhanced parallel port (EPP) circuitry 18.

RF circuitry 16 interfaces with the transmit and receive antennas X1, X2, R1, and R2. RF circuitry 16 modulates the data for transmission to data communication device 13, provides a continuous wave (CW) carrier for backscatter communications with data communication device 13 (in embodiments where backscatter communications are employed), and receives and downconverts the signal received from data communication device 13.

This signal transmitted from data communication device 13 is received via one of the two diversity receive antennas R1 and R2. RF circuitry 16 includes a quadrature downconverter configured to coherently downconvert the received signal from data communication device 13. RF circuitry 16 further includes automatic gain controls (AGCs) coupled to the quadrature down converter. The automatic gain controls provide the in phase and quadrature signals I and Q.

The I and Q signals, which contain the DPSK modulated subcarrier, are passed on to DPSK circuitry 17 for demodulation. DPSK circuitry 17 receives signals I and Q from the RF circuitry 16. In one embodiment, DPSK circuitry 17 includes anti-aliasing filters for filtering the I and Q signals.

Figure 3:
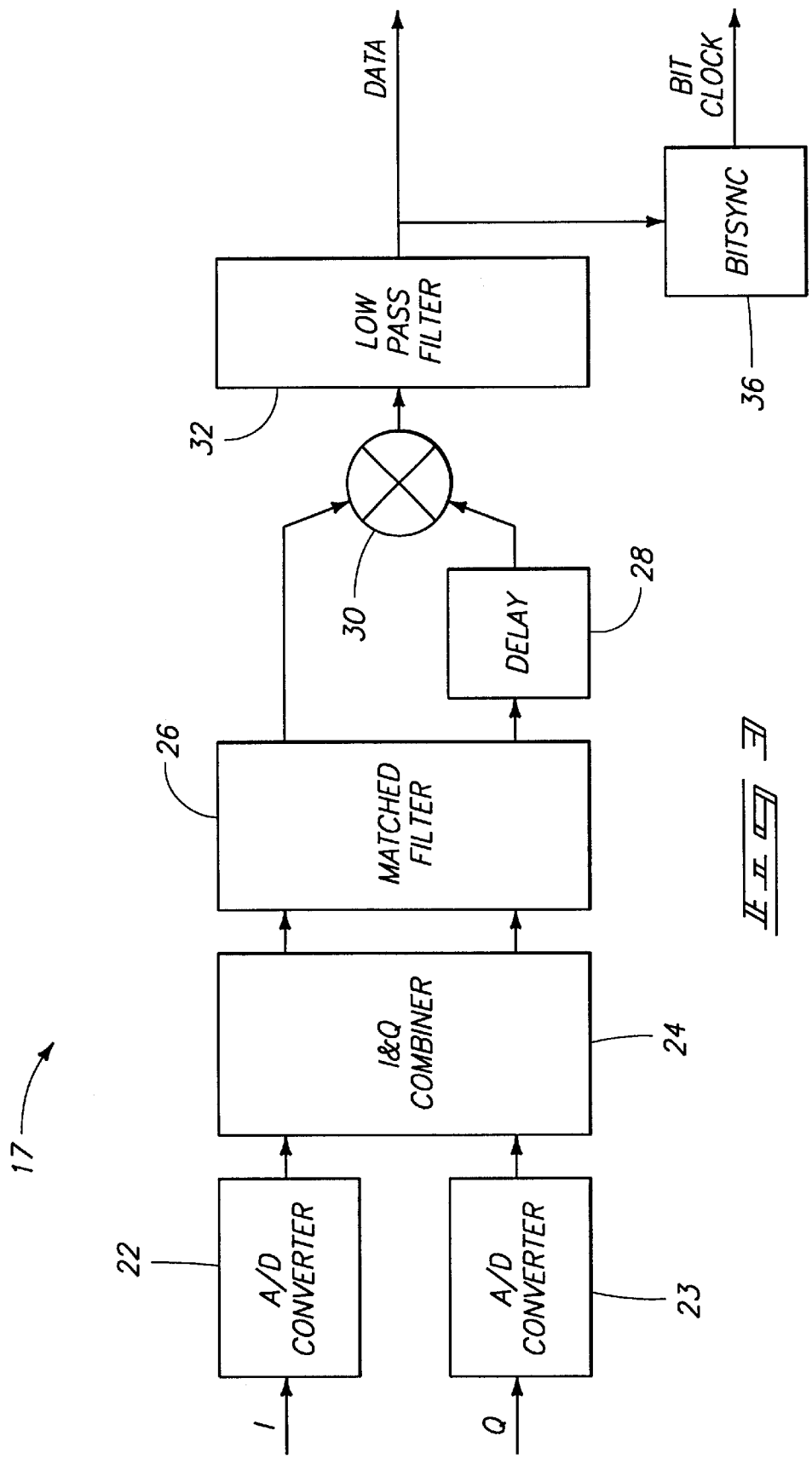
FIG. 3 is a functional block diagram of DPSK circuitry of the interrogator.

Referring to FIG. 3, DPSK circuitry 17 converts the received analog signal to digital format enabling the use of digital bit synchronizer operations in accordance with the present invention. Thus, the I and Q signals are applied to respective analog to digital (A/D) converters 22, 23 for converting the signals from analog to digital signals.

DPSK circuitry 17 further includes digital components including an I & Q combiner 24, matched filter 26, delay circuitry 28, multiplier circuitry 30, low pass filter 32 and bit synchronization circuitry 36. The digital components of DPSK circuit 17 downstream from the A/D converters 22, 23 are implemented in a field programmable gate array in one embodiment of the invention.

I & Q combiner 24 is coupled to A/D converters 22, 23 and configured to combine the digital signals. Matched filter 26 is coupled to the combiner 24 in DPSK circuitry 17 and configured to filter the combined I and Q signals. Delay circuitry 28 is operable to delay the Q signal. Multiplier circuitry 30 is operable to multiply the I signal with the delayed Q signal to remove the subcarrier. Low pass filter circuitry 32 is coupled to the multiplier 30 and configured to filter the output of multiplier circuitry 30. Low pass filter 32 is configured in the described embodiment to remove unwanted products from the signal provided by multiplier circuitry 30.

DPSK circuitry 17 further includes a bit synchronizer 36, also referred to as a bit sync or bit synchronization circuit, in accordance with the present invention. Bit synchronizer 36 is coupled to the low pass filter 32 and configured to receive the outputted data signal. Bit synchronizer 36 is configured to generate a timing signal such as a bit clock signal for sampling of the data signal.

In the described embodiment, the bit clock signal is utilized to provide optimal sampling of the data signal received from data communication device 13. Optimizing the sampling of the received data signal minimizes the error rate. In particular, bit synchronizer 36 provides a bit clock timing signal which is preferably aligned with the bit rate of the data signal received from data communication device 13. The received data signal and generated bit clock signal are applied to EPP circuitry 18.

EPP circuitry 18 provides digital logic circuitry configured to coordinate the sending and receiving of messages with transponder 14. EPP circuitry 18 buffers parallel data received from the host computer 12, converts the data to serial data, and encodes the data. EPP circuitry 18 receives data from transponder 14, converts the received serial data to parallel data, and transfers the parallel data to host computer 12. In one embodiment, messages include up to 64 bytes of data.

Providing an EPP mode interface establishes an asynchronous, interlocked, byte wide, bidirectional channel controlled by host computer 12. The EPP mode allows the host computer 12 to transfer, at high speed, a data byte to or from interrogator 11 within a single host computer CPU I/O cycle (typically 0.5 microseconds per byte).

A serial interface is utilized in place of EPP circuitry 18 in other embodiments of the present invention to provide interfacing of interrogator unit 11 and host computer 12. The serial interface can emulate any standard including RS-232, RS-485 or RS-422. The serial receive data stream is converted to parallel within interrogator unit 11 and returned to serial for communication to host computer 12 in embodiments where a serial interface is utilized.

Figure 4:
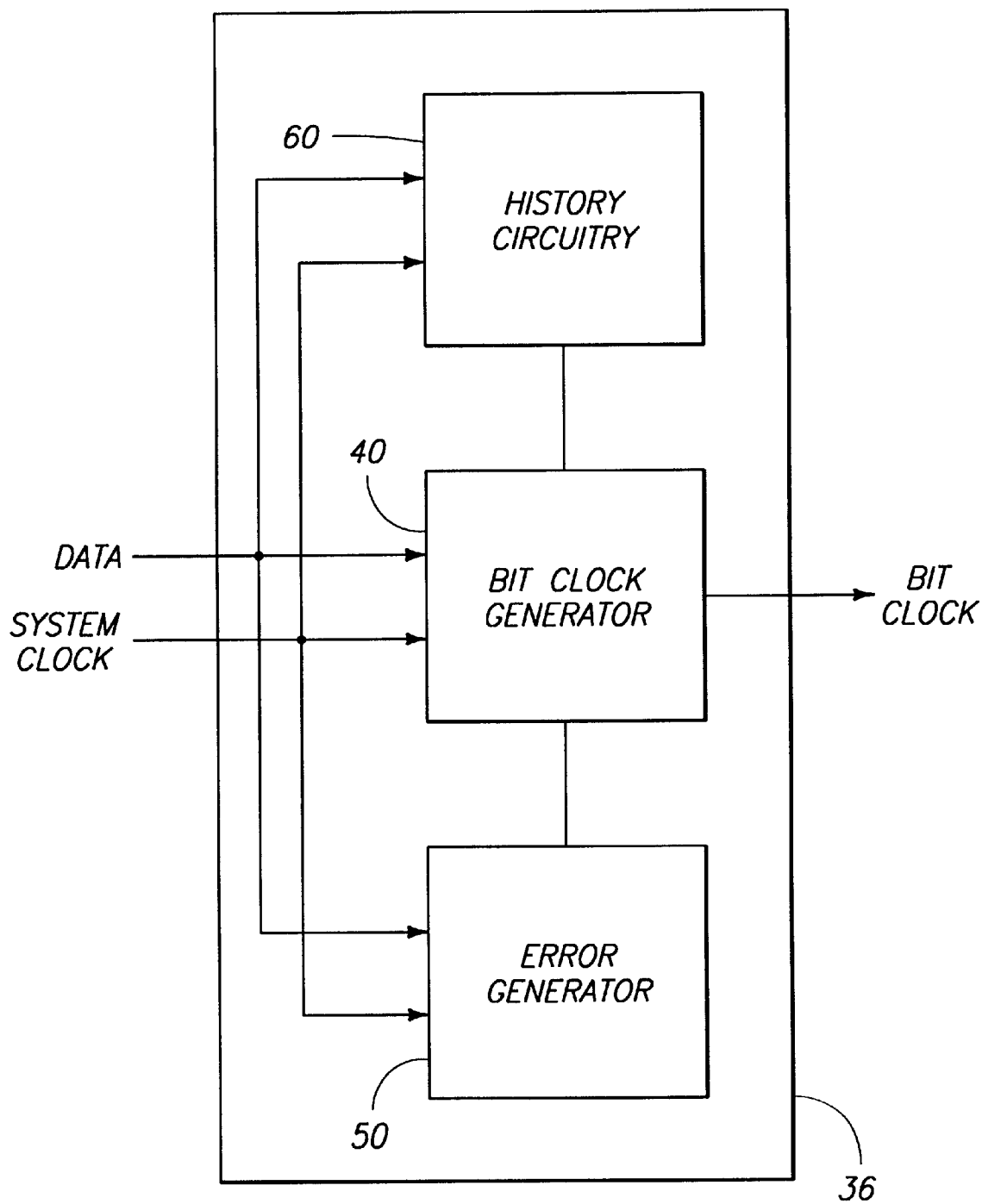
FIG. 4 is a functional block diagram of one embodiment of a bit synchronizer in accordance with the present invention.

Referring to FIG. 4, one embodiment of a bit synchronizer 36 according to the present invention is shown. The illustrated bit synchronizer 36 comprises bit clock generator circuitry 40, error generator circuitry 50 and history circuitry 60. The incoming data signal, received from communications device 13, is applied to bit clock generator 40, error generator 50 and history circuitry 60. As illustrated, a system clock signal, configured to provide timing within interrogator 11, is also applied to bit clock generator 40, error generation circuitry 50 and history circuitry 60 of bit synchronizer 36.

The operations of bit synchronizer 36 are generally described below. Responsive to receiving the incoming data signal and system clock signal, bit synchronizer 36 is configured to output the bit clock signal utilized for aligning the sampling of the received data signal. The bit clock signal preferably has a frequency corresponding to the bit rate of the received data signal.

In general, error generator 50 of bit synchronizer 36 is configured to detect error (e.g., misalignment) of the bit clock signal with respect to the received data signal. History circuitry 60 is ideally configured to provide estimated adjustments to compensate for error during received portions of the data signal wherein timing information is insufficient. Bit clock generator 40 is operable to generate and output the bit clock signal. Further, bit clock generator 40 is operable to adjust the frequency and/or phase of the bit clock signal responsive to signals calculated by error generator circuitry 50 and history circuitry 60.

More specifically, bit synchronizer 36 is operable to convert a nominal frequency signal into the bit clock signal. In one embodiment, bit synchronizer 36 divides the nominal frequency signal to provide the bit clock signal at an appropriate sampling frequency. It is desired to maintain proper alignment of the bit clock signal and the incoming data signal to optimize sampling of the data. Thus, bit synchronizer 36 is configured to selectively adjust at least one of the frequency and phase of the bit clock signal. Varying the frequency and/or phase of the bit clock signal compensates for error between the incoming received data signal and the bit clock signal. Such error may be the result of drift experienced in the incoming data signal.

Figure 5:
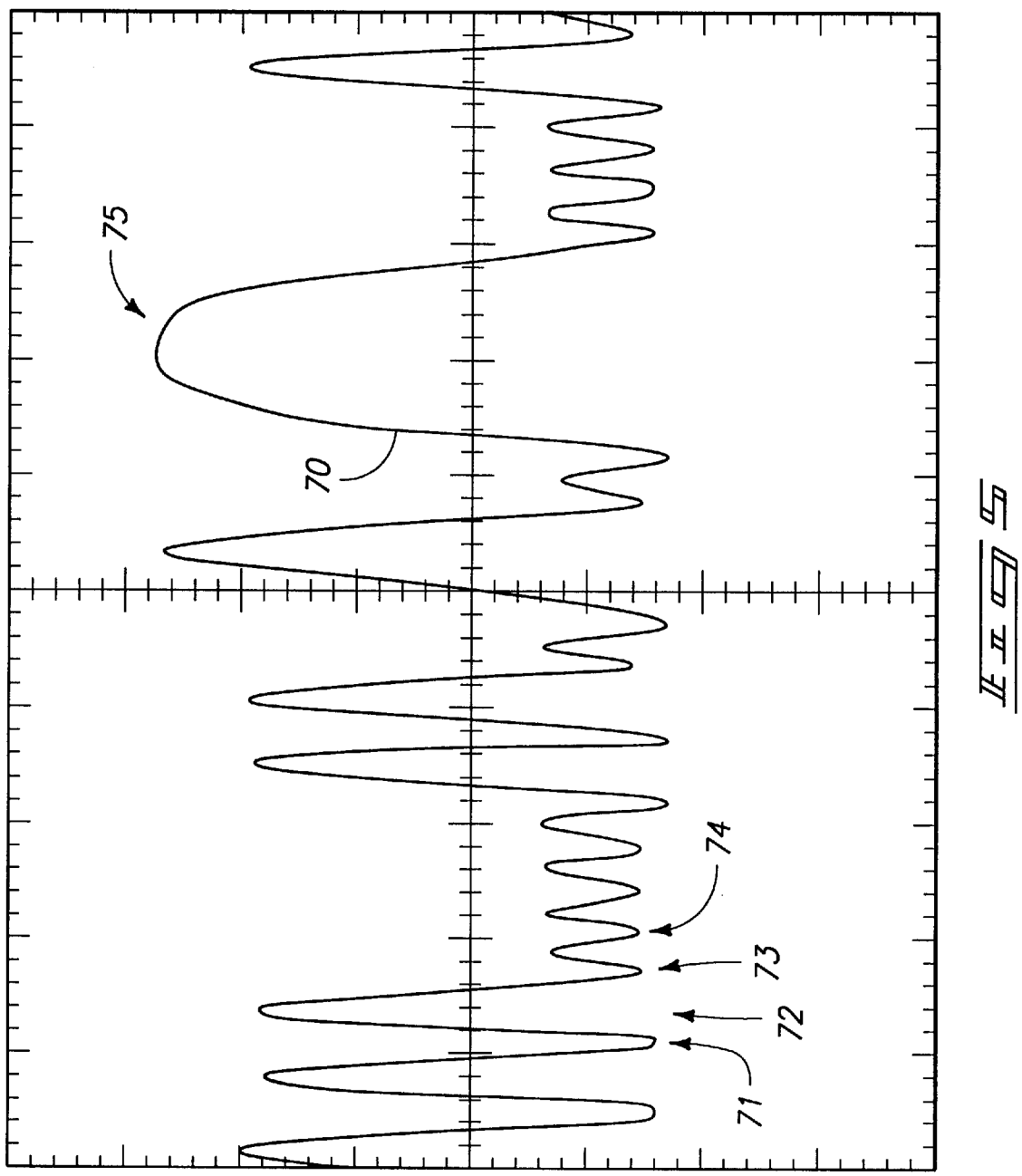
FIG. 5 is a graphical representation of an exemplary segment of a received data signal.

Referring to FIG. 5, an exemplary data signal received within interrogator 11 is shown. The illustrated data signal includes communication information from the data communication device 13 to interrogator 11. One portion of the signal includes a plurality of bits 71–74. Bits 71–74 correspond to digital zero, digital one, digital zero, digital zero, respectively. Consecutive digital ones are illustrated in portion 75 of input signal 70.

Timing information may be derived from some portions of the received data signal. However, other portions of the received data signal may have insufficient or no information available regarding timing. As described below, a series of consecutive ones provides insufficient information regarding timing according to one embodiment of the invention. The generated bit clock may acquire some error in its alignment since in a digital system absolute alignment is not likely because only discrete values are available to set the clock rate.

The bit synchronizer 36 according to the present invention is configured to monitor error and minimize error to provide optimal sampling of the received data signal. In one embodiment, the preferred bit synchronizer 36 is operable to approximate error during reception of portions of the data signal which contain insufficient or no timing information.

In accordance with one embodiment of the present invention, past information is utilized to approximate error during such portions of the data signal which contain insufficient or no timing information. If the incoming data rate is in fact fixed or only changing minutely, then future updates should generally resemble past updates to the clock period.

One embodiment of bit synchronizer 36 is configured to accumulate a history of error of the bit clock signal with respect to the data signal. The history may be utilized for future updates of the bit clock. In particular, the history is preferably utilized when timing information within the data signal is insufficient. Information directly obtainable from the incoming data signal takes precedence. However, if such timing information in the data signal is insufficient, then the recorded history can be utilized to approximate error and provide estimated updates of the bit clock signal until adequate timing information is received.

Figure 6:
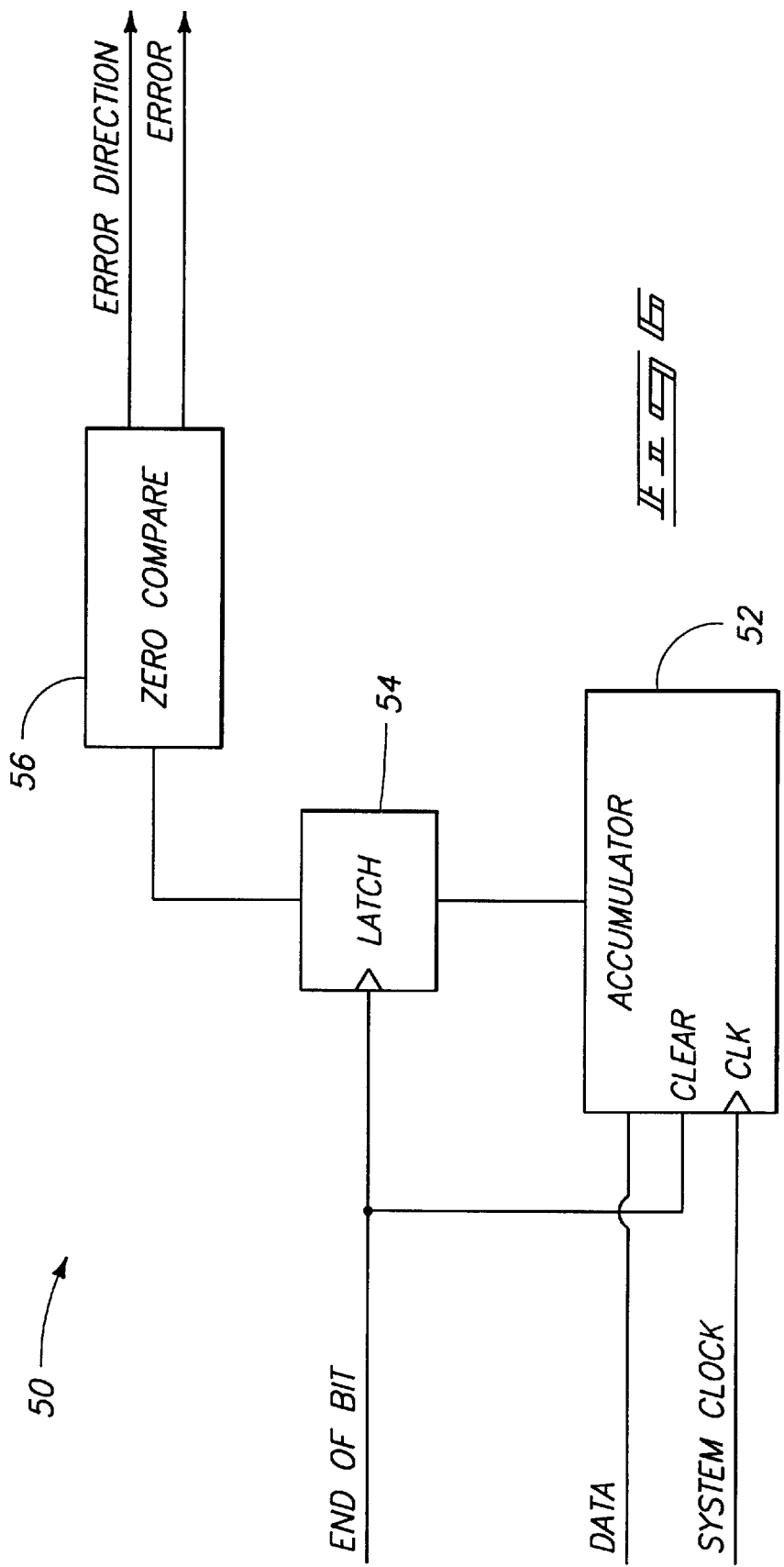
FIG. 6 is a functional block diagram of one embodiment of error generation circuitry of the bit synchronizer.

Referring to FIG. 6, error generation circuitry 50 comprises an accumulator 52, latch 54 and zero compare circuitry 56. Error generation circuitry 50 is configured to receive the data signal, the system clock signal and an end of bit signal. As described below, the end of bit signal is generated by bit clock generator 40. Bit clock generator 40 asserts the end of bit signal for the duration of one period of the system clock corresponding to the end of a bit period within the received data signal. The end of bit signal is preferably generated for all bits of the data signal.

Responsive to receiving the end of bit signal, incoming data signal and the system clock signal, error generator 50 is configured to monitor the error of the bit clock signal with respect to the data signal. The described embodiment of error generator 50 is configured to generate error update signals. Such error update signals comprise an error signal representing the magnitude of error and an error direction signal corresponding to the direction of error (i.e., whether the current bit clock signal leads or lags the incoming data signal).

Error is monitored for at least two purposes. Primarily, error is calculated to enable real time correction of the bit clock signal to assure proper alignment with the received data signal. Error is also utilized to develop a history for later use responsive to insufficient timing information within the data signal (e.g., a series of digital ones). The history is utilized to approximate error during such periods of insufficient timing information. The history accumulates error measurements from error generator 50 when the data signal contains sufficient timing information.

In particular, error generator 50 monitors error of the bit clock signal with respect to the data signal when sufficient timing information is present within the received data signal. The incoming data signal and system clock signal are applied to accumulator 52 of error generator 52. Accumulator 52 calculates error for each bit of the incoming data signal having sufficient timing information (e.g., digital zeros in the described embodiment as described hereafter).

The described embodiment of communication system 10 is configured to utilize DPSK modulation for communications. In general, a phase change of a subcarrier is used in DPSK modulation systems to discriminate a digital one from a digital zero. When the phase change occurs there is less energy at the fundamental frequency of the subcarrier than when there is no phase change. The subcarrier is bandpass filtered around the fundamental subcarrier frequency. The recovered data stream has a dip where phase changes in the received data signal occur.

DPSK systems may be configured such that either a digital one or a digital zero provides a phase change. In the described embodiment, bit synchronizer 36 is configured such that a digital low bit (i.e., digital zero) causes a phase change. However, bit synchronizer 36 could be configured such that a digital high bit (i.e., digital one) causes a phase change.

In the described configuration of interrogator 11, the middle of a digital zero bit has a greater amplitude than the ends of the bit. The increased amplitude in the middle of the zero bit is a result of a phase change at the edges of the bit or a transition to a digital one. It is preferred for interrogator 11 to sample at the middle of the digital zero bit where the highest value is provided.

Timing information of the data signal is extracted at either bit transitions or when digital zero bits are recovered. Analyzing digital zeros is preferred because such an analysis provides information at transitions as well as during the reception of consecutive digital zeros. Timing information is not available in the described configuration during reception of digital ones.

Referring to FIG. 7, an exemplary segment of a received data signal 70 is shown. The present invention provides plural methods of extracting information present in a digital zero bit period. Two methods of extracting information from data signal 70 are shown and described herein. The exemplary methods analyze areas defined by data signal 70.

In the illustrated segment of the received data signal 70, first areas 77, 78 are centered about zeros while second areas 79, 80 are centered around transitions. Regardless of whether areas centered about zeros or transitions are analyzed, the areas are compared to provide alignment in accordance with the described embodiment. The bit clock signal is adjusted responsive to the areas being unequal.

A first method of extracting information analyzes the sum of magnitudes of the data signal in a first area or portion 77 of a selected digital value and the sum of the magnitudes of the data signal in a second area or portion 78 of the selected digital value. The selected digital value corresponds to a bit represented by bit clock period 90 in FIG. 7. The sum of magnitudes of the respective first and second portions 77, 78 are referred to herein as first and second reference values. The first and second portions 77, 78 of bit clock period 90 are preferably respective halves of the bit defined by bit clock period 90. The first and second reference values of the bit clock period 90 are compared. Ideally, the two reference values should be equal to provide optimal sampling of the received data signal. Negligible error is present between the bit clock signal and the data signal if the two reference values are equal.

A second method of extracting information analyzes the sum of magnitudes of the data signal in a first area or portion 79 prior to a transition 91 and the sum of the magnitudes of the data signal in a second area or portion 80 subsequent to the transition 91. The sum of magnitudes of the respective first and second portions 79, 80 are also referred to as first and second reference values. The first and second reference values about the transition 91 are compared and are ideally equal to provide optimal sampling of the received data signal. Again, negligible error is present between the bit clock signal and the data signal if the two reference values are equal.

Referring again to FIG. 6, accumulator 52 provides first and second reference values corresponding to respective areas of a bit clock or areas adjacent a transition. Responsive to the assertion of the end of bit signal via bit clock generator 40, latch 54 stores the first and second reference values generated via accumulator 52. The application of the end of bit signal to accumulator 52 clears the values therein enabling analysis of a subsequent, preferably next, bit in the data signal.

The first and second reference values are applied to zero compare circuitry 56 from latch 54. Zero compare 56 is configured to determine the difference (if any) between the first and second reference values. Such difference between the values corresponds to an error value. The error value represents variance between the bit clock signal and the data signal. Zero compare 56 is operable to compare the error value to zero. No error is present between the data signal and bit clock signal in the currently analyzed bit if the error value is equal to zero.

Error is present for non-zero error values. The magnitude of the error is represented by the non-zero value. In addition, the direction (whether the bit clock signal is leading or lagging the incoming data signal) is indicated by the sign of the non-zero value. Zero compare 56 outputs an error signal and error direction signal corresponding to the error value and the direction (i.e., leading, lagging) of the error, respectively.

Figure 8B:
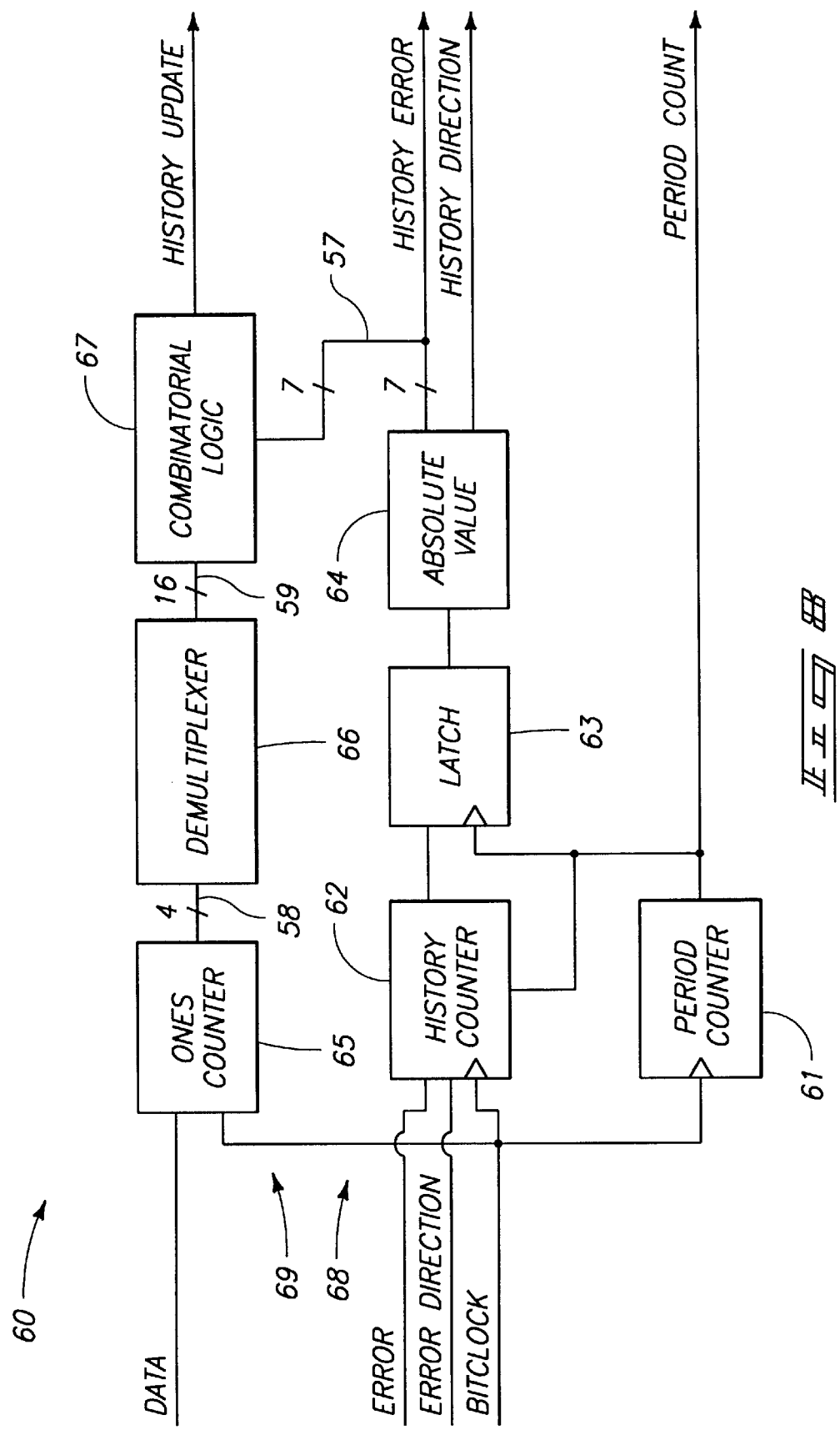
FIG. 8 is a functional block diagram of one embodiment of history circuitry of the bit synchronizer.

Referring to FIG. 8, one embodiment of history circuitry 60 is illustrated. History circuitry 60 is configured to provide history acquisition and use operations. History acquisition and use operations corresponding to previous error calculations are discussed below. Such history error information is utilized when the error between the data signal and bit clock signal is not measurable due to insufficient information within the data signal.

In the illustrated embodiment, the history is determined during a preamble of the incoming data signal. The data signal generally comprises a preamble, also referred to as a first portion of the data signal, and a data portion or second portion which contains the data. The determined history is utilized if needed during the subsequent second portion of the incoming data signal until another preamble is received. The history is updated during the subsequent preamble in the described embodiment.

The preamble of the incoming data signal is ideally preprogrammed to contain timing information enabling a plurality and preferably numerous error measurements. In one embodiment, the preamble comprises 256 bits of alternating ones and zeros. Such a preamble comprises 128 zero bits enabling 128 error measurements.

More specifically, the illustrated history circuitry 60 comprises a history acquisition circuitry portion 68 and a history use circuitry portion 69. The illustrated history acquisition circuitry 68 comprises a period counter 61, history counter 62, latch 63, and absolute value circuitry 64. The illustrated history use circuitry 69 comprises a ones counter 65, demultiplexer 66 and combinatorial logic 67.

History acquisition portion 68 and history use portion 69 are configured to output history signals. More specifically, the output of history acquisition circuitry 68 includes a history error signal and history direction signal. The history use portion 69 provides a history update output signal.

History acquisition portion 68 provides a cumulative error measurement corresponding to error of the bit clock signal with respect to the data signal during the preamble of the incoming data signal. In particular, error and error direction signals indicating the presence of error are received from error generation circuitry 50 and applied to history counter 62. In addition, the bit clock signal is applied to history counter 62 and period counter 61. Period counter 61 is configured in the described embodiment to count a predetermined number of bits corresponding to the length of the preamble of the incoming data. Period counter 61 thereafter outputs a period count signal corresponding to the end of individual preambles.

History counter 62 totals the received error values (magnitude and direction) from error generator 50. Error in one given direction (leading or lagging) is subtracted from error in the opposite direction providing net error magnitude and error direction. The period count signal is applied to history counter 62 and latch 63 corresponding to the end of a preamble. Once the period count signal is asserted, the net error (magnitude and direction) is stored within latch 63 and the history counter 62 is reset. The calculated error is thereafter applied to absolute value circuitry 64 which generates history error and history direction signals respectively providing the magnitude and direction of the net error accumulated during the preamble. The history error signal comprises a seven-bit value in the described embodiment of the present invention. The maximum error is 128 corresponding to the 128 zeros within the predefined preamble of the data signal. Preambles of other lengths are possible and such preambles would provide other possible error magnitudes. In such embodiments, the history error signal may comprise more or less bits than seven.

As previously indicated, error may be calculated during the reception of digital zeros in the incoming data signal in the described embodiment. Additionally, insufficient timing information is present when consecutive digital ones are received within the data signal. Ones counter 65 is configured to count the number of consecutive ones within the received data corresponding to insufficient timing data within the received data signal.

The magnitude of history counter 62 represents how often error (in excess of canceled error values) was detected during the preamble. In the described embodiment, the magnitude of history counter 62 corresponding to error during the preamble and the number of consecutive ones received during the data portion of the data signal are utilized to determine if the phase and/or frequency of the bit clock signal should be adjusted during periods of insufficient timing information.

The sign of the history counter 62 determines whether the clock frequency or phase should be increased or decreased for subsequent bit periods. If the content of history counter 62 is half the magnitude of the period counter 61 (indicated by the most significant bit of the history counter being set), then updates are preferably made every other bit during periods when insufficient timing information is extracted from the data signal. As discussed below, less updates are necessary if the magnitude of the history is smaller.

The output of ones counter 65 is applied to demultiplexer 66 via a 4-bit bus 58. Demultiplexer 66 selects one of a plurality of output lines responsive to the received output from counter 65. The output lines are applied to combinatorial logic 67 via a 16 bit bus 59.

Figure 9:
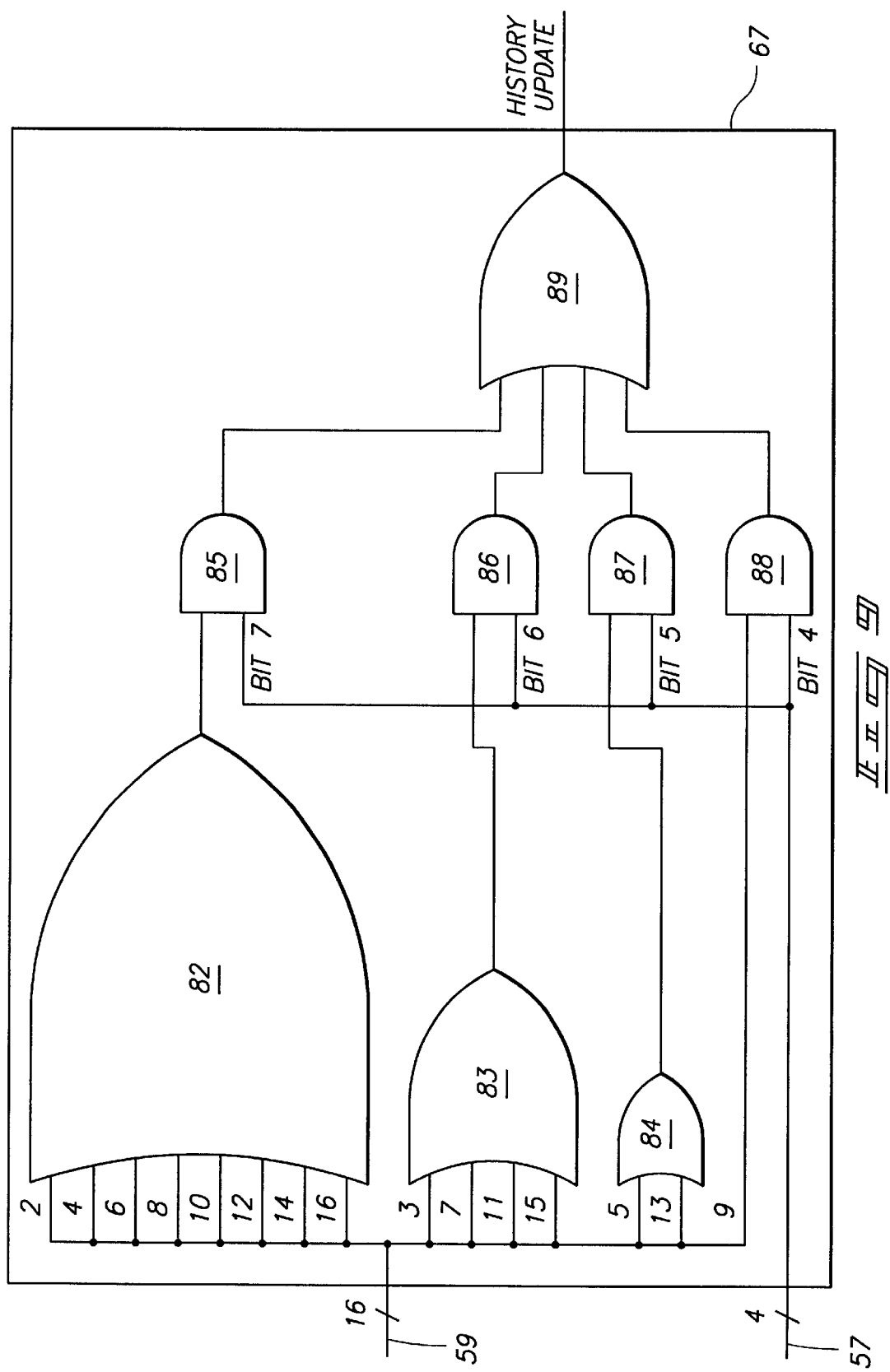
FIG. 9 is a schematic diagram of combinatorial logic of the history circuitry.

Referring to FIG. 9, one embodiment of combinatorial logic 67 is shown. Combinatorial logic 67 is configured according to Table 1 in the described embodiment. Combinatorial logic 67 defines which bit of history error (error magnitude) is analyzed according to the number of consecutively received digital ones (i.e., number of bits received since the last update). Other configurations of combinatorial logic 67 are possible.

TABLE 1

| Number of Bits Since Update | History Bit Weight (msb = 7) |
| --- | --- |
| 1 | |
| 2 | 7 |
| 3 | 6 |
| 4 | 7 |
| 5 | 5 |
| 6 | 7 |
| 7 | 6 |
| 8 | 7 |
| 9 | 4 |
| 10 | 7 |
| 11 | 6 |
| 12 | 7 |
| 13 | 5 |
| 14 | 7 |
| 15 | 6 |
| 16 | 7 |

The illustrated embodiment of combinatorial logic 67 comprises plural logic gates coupled with 16-bit bus 59 and 4-bit bus 57. Lines 2–16 of demultiplexer output are sequentially selected by demultiplexer 66 responsive to the output of ones counter 65 (i.e., number of consecutive digital ones received within the data signal). For example, if six consecutive digital ones are received then line 6 is selected. If another digital one is received, then line 7 is selected.

Even lines 2, 4, 6, 8, 10, 12, 14 and 16 of demultiplexer output are applied to OR gate 82 via bus 59. The output of OR gate 82 is applied to AND gate 85 along with the most significant bit (MSB) of the history error. The MSB of history error is bit 7 in the described embodiment corresponding to a maximum error magnitude of 128. The history error is applied via bus 57.

Odd lines 3, 7, 11, 15 of demultiplexer output are applied via bus 59 to OR gate 83. The output of OR gate 83 is applied to AND gate 86 along with the next most significant bit of the history error (e.g., bit 6). Lines 5, 13 of demultiplexer output are applied to OR gate 84. The output of OR gate 84 is applied to AND gate 87 along with the next most significant bit of the history error (e.g., bit 5). Line 9 of demultiplexer output is applied to AND gate 88 along with the next most significant bit of the history error (e.g., bit 4). The outputs of AND gates 85–88 are applied to OR gate 89. The output of OR gate 89 is the history update signal utilized to specify when the history is to be utilized to adjust the bit clock signal.

As shown in FIG. 9, if bit 7 of history error is set (i.e., determined from history counter 62), selecting any of even lines 2, 4, 6, 8, 10, 12, 14, 16 of the demultiplexer output results in the utilization of the history as indicated by history update. Selection of the lines 2, 4, 6, 8, 10, 12, 14, 16 corresponds to the number consecutive digital ones received. If bit 6 of history error is set, selecting any of lines 3, 7, 11, 15 of the demultiplexer output results in the utilization of the history. If bit 5 of history error is set, selecting any of lines 5, 13 of the demultiplexer output results in the utilization of the history. If bit 4 of history error is set, selecting line 9 of the demultiplexer output results in the utilization of the history.

Referring to FIG. 10, one embodiment of bit clock generator 40 is shown. Bit clock generator 40 is configured to generate the bit clock signal and end of bit signal. The illustrated bit clock generator 40 contains a reference counter 42, reloadable counter 44, counter decoder 46 and plurality of multiplexers 47, 48, 49.

Bit clock generator 40 is configured to adjust the bit clock signal responsive to the error and history. The illustrated embodiment of bit clock generator 40 is configured to manipulate one or both of the frequency and phase of the bit clock signal to align the bit clock signal with the data signal to provide optimal sampling. Other configurations of bit clock generator 40 are possible.

Reference counter 42 is configured to provide a nominal frequency signal utilized to derive the bit clock signal. The reference counter 42 is initialized to provide an initial frequency. Responsive to the history error and history direction signals, reference counter 42 is operable to vary the nominal frequency in order to align the bit clock signal with the bit rate of data signal. In one embodiment, if the history error (i.e., error magnitude) is in excess of a threshold value (e.g., cumulative error being over 40 updates in one direction) following reception of the preamble, reference counter 42 either increases or decreases the nominal frequency to align the bit clock signal with the bit rate data signal for optimal sampling of the data. The nominal frequency is either increased or decreased responsive to the direction of the error.

Counter 44 comprises a reloadable downcounter in one embodiment of the invention. Counter 44 provides division operations of the nominal frequency supplied via reference count 42. The output of counter 44 provides the bit clock signal. For example, a 156 Khz bit clock signal is provided for a nominal frequency of 10 Mhz and a loaded counter value of 64.

Reloading of counter 44 corresponds to the start of a new period of the bit clock signal. The phase of the bit clock signal may be varied responsive to varying the timing of reloading counter 44. A period of the bit clock signal may correspond to either an entire bit or half of one bit and half of a subsequent bit.

Referring to FIG. 11, counter 44 is reloaded at mid bit of the data signal in one embodiment of the invention. In particular, the data signal 70 and bit clock signal 76 are shown. The areas defined by data signal 70 are measured by accumulator 52 at position 84 of the bit clock 76. Counter 44 is updated at position 85 (i.e., mid bit) of the bit clock 76. In a second embodiment, counter 44 is loaded at the crossing point or end of bit interval.

Referring again to FIG. 10, adjusting the phase of the bit clock signal (i.e., adjusting the timing of reloading of counter 44) is controlled via multiplexers 47–49 and the respective input signals thereof. Multiplexer 49 applies a LOAD control signal to counter 44 to control the timing of the reloading of the count down value (and control varying of the phase of the bit clock signal).

Count decoder 46 contains a shift register in one embodiment for generating plural load control signals, also referred to as load timing signals. In one example, count decoder 46 generates on time, early and late load timing signals during the individual countdown periods of counter 44. Once counter 44 has counted down to a first predetermined value (e.g., 3) count decoder 46 is configured to assert the late signal. Once counter 44 has counted down to a second predetermined value (e.g., 0) count decoder 46 is configured to assert the on time signal. Once counter 44 has counted down a third predetermined value (e.g., −3) count decoder 46 is configured to assert the early signal. The load control signals are applied via bus 41 to multiplexers 47, 48.

The application of one of early, on time, late signals dictates the timing of the reloading of counter 44 and any adjustment of the phase of the bit clock signal. In particular, bit clock generator 40 is operable to apply either the early load timing signal or late load timing signal responsive to the phase of the bit clock signal leading or lagging the bit rate of the data signal, respectively. Additionally, the on-time load timing signal of the bit rate of the data signal and bit clock signal are in phase.

The phase of the bit clock signal is delayed responsive to receiving the early signal. The phase of the bit clock signal is moved ahead in time responsive to receiving the late signal. No adjustment to the phase of the bit clock signal is made responsive to receiving the on time signal. In the described embodiment, one load control signal is applied to counter 44 in one given bit period.

The error update signals and history signals dictate which one of the load control signals is applied to counter 44. In accordance with the above, the error direction and error signals determine the timing of reloading of counter 44 (i.e., select one of the load control signals) responsive to the current received data bit being a digital zero. Alternatively, the history direction and history update signals determine the timing of reloading of counter 44 responsive to the current received data bit being a digital one.

Multiplexer 49 selects whether error generation circuitry 50 or history circuitry 60 (i.e., the error update signals or history signals) times the reloading of counter 44. Multiplexer 49 selects either the error signals or the history signals responsive to the data signal. Responsive to the current bit of the data signal being digital zero, multiplexer 49 selects the error update signals of error generator 50. Responsive to the current bit of the data signal being digital one multiplexer 49 selects the history signals of history circuitry 60.

Count decoder 46 outputs the end of bit signal corresponding to the frequency of the bit clock signal and the end of a bit in the bit clock signal. In particular, the end of bit signal is asserted for one period of the system clock at the end of individual bit periods of the bit clock signal. Referring again to FIG. 11, the end of bit signal may be asserted at position 81 of the bit clock signal 76.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A bit synchronizer configured to generate a timing signal for sampling a data signal comprising:
   an error generator configured to detect error of the timing signal with respect to the data signal and output error update signals responsive to the detection of error;
   a bit clock generator configured to output the timing signal responsive to the error update signals during a first portion of the data signal and a plurality of history signals during a second portion of the data signal; and
   history circuitry configured to receive the error update signals and generate a history comprising error information during the first portion of the data signal and generate the history signals during the second portion of the data signal responsive to the history comprising the error information.

2. The bit synchronizer according to claim 1 wherein the first portion is a preamble of the data signal.

3. The bit synchronizer according to claim 2 wherein the preamble comprises alternating digital high and digital low data.

4. The bit synchronizer according to claim 1 wherein the second portion of the data signal intermittently contains insufficient timing information.

5. The bit synchronizer according to claim 4 wherein the history circuitry is configured to detect insufficient timing information.

6. The bit synchronizer according to claim 1 wherein the history circuitry is adapted to accumulate the error update signals during the first portion of the data signal.

7. The bit synchronizer according to claim 1 wherein the bit clock generator comprises:
   a reference counter configured to generate a nominal frequency signal;
   a reloadable counter configured to count a predetermined number of counts responsive to the nominal frequency signal; and
   a count decoder configured to output plural load timing signals responsive to the count of the reloadable counter.

8. The bit synchronizer according to claim 7 wherein the reloadable counter is reloaded responsive to receiving one of the load timing signals.

9. The bit synchronizer according to claim 7 wherein the bit clock generator further comprises a multiplexer configured to select one of the history signals and error update signals for controlling the applying of load timing signals to the counter, the multiplexer being configured to select responsive to the data signal.

10. The bit synchronizer according to claim 7 wherein the bit clock generator is adapted to adjust the load timing signals responsive to the bit clock signal.

11. The bit synchronizer according to claim 7 wherein the reference counter is configured to adjust the nominal frequency signal responsive to the history signals.

12. The bit synchronizer according to claim 7 wherein the timing of the loading of the reloadable counter is responsive to the load timing signals, error update signals and history signals.

13. The bit synchronizer according to claim 1 wherein the error update signals comprise error magnitude and error direction information.

14. The bit synchronizer according to claim 1 wherein the history signals comprise history magnitude and history direction information.

15. The bit synchronizer according to claim 1 wherein the error generator comprises:
   an accumulator for measuring first and second reference values of the data signal; and
   a comparator configured to generate an error magnitude and an error direction signal responsive to a comparison of the first and second reference values.

16. The bit synchronizer according to claim 1 wherein the first and second reference values correspond to portions of the data signal including respective portions of a bit.

17. The bit synchronizer according to claim 1 wherein the first and second reference values correspond to portions of the data signal adjacent a transition of data from one digital value to another digital value.

18. A method of synchronizing with a data signal comprising:
   providing a data signal having a first portion and a second portion;
   generating a timing signal;
   first adjusting the timing signal during the first portion of the data signal; and
   accumulating a history comprising error information during the first portion of the data signal; and
   second adjusting the timing signal during a second portion of the data signal using the history comprising the error information.

19. The method according to claim 18 further comprising sampling the data signal according to the timing signal.

20. The method according to claim 18 wherein the first portion of the data signal comprises a preamble.

21. The method according to claim 20 wherein the preamble comprises alternating digital high and digital low values.

22. The method according to claim 18 further comprising detecting insufficient timing information within the second portion of the data signal and the second adjusting being responsive to the detecting.

23. The method according to claim 18 wherein the adjustings individually comprise adjusting at least one of frequency and phase of the timing signal.

24. The method according to claim 18 further comprising determining error of the timing signal with respect to the data signal.

25. The method according to claim 24 wherein the determining comprises:

measuring first and second reference values corresponding to respective portions of the data signal; and comparing the first and second reference values.

26. The method according to claim 25 wherein the first and second reference values correspond to respective portions of a bit.

27. The method according to claim 25 wherein the first and second reference values correspond to portions of the data signal adjacent a transition of data from one digital value to another digital value.

28. The method according to claim 25 further comprising adjusting the phase of the timing signal responsive to the determined timing signal error and adjusting the frequency of the timing signal responsive to the history.

29. The method according to claim 24 wherein the accumulating comprises totaling the error during the first portion of the data signal.

30. The method according to claim 24 wherein the error comprises magnitude and direction information.

31. The method according to claim 18 wherein the history comprises magnitude and direction information.

32. The method according to claim 18 wherein the generating the timing signal comprises:

providing a nominal frequency signal; and converting the nominal frequency to a bit clock signal.

33. The method according to claim 32 wherein the converting comprises:

loading a counter value; and counting to the counter value according to the nominal frequency signal.

34. The method according to claim 33 further comprising:

determining error of the timing signal with respect to the data signal; and adjusting the timing of the loading of the counter value responsive to one of error and the history.

35. A method of synchronizing with a data signal comprising:

providing a data signal including digital information;

deriving timing information during a first portion of the data signal;

generating a timing signal;

determining error of the timing signal with respect to the data signal during the first portion of the data signal;

detecting an absence of timing information during a second portion of the a data signal;

generating a history responsive to the determining and prior to the detecting; and adjusting the timing signal during the second portion of the data signal responsive to the history.

36. The method according to claim 35 further comprising sampling the data signal according to the timing signal.

37. The method according to claim 35 wherein the first portion of the data signal comprises a preamble.

38. The method according to claim 37 wherein the preamble comprises alternating digital high and digital low values.

39. The method according to claim 35 wherein the adjusting comprises individually adjusting at least one of the frequency and the phase of the timing signal.

40. The method according to claim 35 wherein the determining comprises:

measuring first and second reference values of the data signal; and comparing the first and second reference values.

41. The method according to claim 40 wherein the first and second reference values correspond to portions of the data signal including respective portions of a bit.

42. The method according to claim 40 wherein the first and second reference values correspond to portions of the data signal adjacent a transition of data from one digital value to another digital value.

43. The method according to claim 35 wherein the adjusting comprises:

adjusting the phase of the timing signal responsive to the error; and adjusting the frequency of the timing signal responsive to the history.

44. The method according to claim 35 wherein the history comprises magnitude and direction information.

45. The method according to claim 35 wherein the error comprises magnitude and direction information.

46. The method according to claim 35 wherein the generating the timing signal comprises:

providing a nominal frequency signal; and converting the nominal frequency signal to a bit clock signal.

47. The method according to claim 46 wherein the converting comprises:

loading a counter value; and counting to the counter value responsive to the nominal frequency signal.

48. The method according to claim 47 further comprising adjusting the timing of the loading of the counter value responsive to one of error and history.

49. A method of calculating error of a timing signal with respect to a data signal comprising:

receiving a data signal containing plural digital values;

first analyzing the data signal corresponding to a first portion of a selected digital value of the data signal;

providing a first reference value responsive to the first analyzing;

second analyzing the data signal corresponding to a second portion of the selected digital value of the data signal;

providing a second reference value responsive to the second analyzing; and comparing the first reference value with the second reference value.

50. The method according to claim 49 further comprising generating a timing signal corresponding to the data signal.

51. The method according to claim 50 wherein the timing signal defines the first and second portions of the selected digital value of the data signal.

52. The method according to claim 50 wherein the timing signal has a frequency approximately equal to a bit rate of the data signal.

53. The method according to claim 49 wherein the first and second portions correspond to respective halves of the selected digital value.

54. The method according to claim 49 wherein the selected digital value corresponds to a bit of the data signal.

55. The method according to claim 49 wherein the selected digital value is a digital zero.

56. The method according to claim 49 wherein the first and second analyzings comprise measuring areas of the respective first and second portions of the selected digital value.

57. The method according to claim 49 wherein the comparing comprises subtracting the first and second reference values.

58. The method according to claim 50 wherein the comparing defines the error of the timing signal with respect to the data signal.

59. A method of synchronizing with a data signal comprising:

providing a data signal including a preamble and a data portion;

generating a timing signal having a phase and frequency, the generating including:

providing a nominal frequency signal; and converting the nominal frequency signal to a bit clock signal;

sampling the data signal according to the timing signal;

determining error of the timing signal with respect to the data signal, the determining including:

measuring first and second reference values of the data signal; and comparing the first and second reference values;

first adjusting the phase of the timing signal during the preamble of the data signal, the first adjusting being responsive to the determining;

accumulating a history during the preamble and responsive to the determining;

adjusting the frequency of the nominal frequency signal using the history;

detecting an absence of timing information within the data signal; and following the detecting, second adjusting the phase of the timing signal using the history during the data portion of the data signal having the absence of timing information.

* * * * *

UNITED STATES PATENT AND TRADEMARK OFFICE
CERTIFICATE OF CORRECTION

PATENT NO. : 6,223,317 B1
DATED : April 24, 2001
INVENTOR(S) : George E. Pax et al.

It is certified that error appears in the above-identified patent and that said Letters Patent is hereby corrected as shown below:

Column 15,
Line 47, please delete "a" after "the".

Signed and Sealed this

Thirtieth Day of October, 2001

Attest:

*Nicholas P. Godici*

NICHOLAS P. GODICI
*Attesting Officer*  *Acting Director of the United States Patent and Trademark Office*